US008913706B2

(12) United States Patent
Cao et al.

(10) Patent No.: US 8,913,706 B2
(45) Date of Patent: Dec. 16, 2014

(54) MULTI-CHANNEL MULTI-PROTOCOL TRANSCEIVER WITH INDEPENDENT CHANNEL CONFIGURATION USING SINGLE FREQUENCY REFERENCE CLOCK SOURCE

(75) Inventors: Jun Cao, Irvine, CA (US); Afshin Momtaz, Laguna Hills, CA (US); Chung-Jue Chen, Irvine, CA (US); Kang Xiao, Irvine, CA (US); Vivek Telang, Austin, TX (US); Ali Ghiasi, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 364 days.

(21) Appl. No.: 12/860,596

(22) Filed: Aug. 20, 2010

(65) Prior Publication Data

US 2012/0007640 A1  Jan. 12, 2012

Related U.S. Application Data

(60) Provisional application No. 61/362,589, filed on Jul. 8, 2010.

(51) Int. Cl.
*H03D 3/24* (2006.01)

(52) U.S. Cl.
USPC .......................................................... 375/376

(58) Field of Classification Search
CPC ........... H04L 7/02; H04L 7/33; H04L 7/0331; H04L 7/0337
USPC ............................ 375/327, 371, 373, 375, 376
See application file for complete search history.

(56) References Cited

U.S. PATENT DOCUMENTS

| | | | | |
|---|---|---|---|---|
| 5,369,785 A | * | 11/1994 | Korhonen et al. | 455/67.11 |
| 5,864,572 A | * | 1/1999 | Bhagwan | 714/815 |
| 6,469,553 B1 | * | 10/2002 | Sung et al. | 327/156 |
| 7,812,659 B1 | * | 10/2010 | Shumarayev et al. | 327/291 |
| 7,821,343 B1 | * | 10/2010 | Wong et al. | 331/2 |
| 2004/0161070 A1 | * | 8/2004 | Yin et al. | 375/371 |
| 2005/0046491 A1 | * | 3/2005 | Smith | 331/25 |

* cited by examiner

*Primary Examiner* — Kevin Kim
(74) *Attorney, Agent, or Firm* — Sterne, Kessler, Goldstein & Fox P.L.L.C.

(57) ABSTRACT

A circuit for producing one of a plurality of output clock frequencies from a single, constant input reference clock frequency. The circuit comprises a reference clock system and a phase lock loop. The reference clock system includes a bypass path, a divider path including a first integer divider, and a multiplexer. A divisor of the first integer divider is based on a selected communications protocol of a group of possible communications protocols. The multiplexer is configured to route the bypass path or the divider path based on the selected communications protocol. The phase lock loop includes a voltage controlled oscillator and a feedback path. The feedback path includes a second integer divider. A divisor of the second integer divider is based on the selected communications protocol. The reference clock system is configured to receive a constant reference clock frequency. The voltage controlled oscillator is configured to produce one of a plurality of output clock frequencies corresponding to the selected communications protocol. The selected output clock frequency is produced based on at least one of the routing of the multiplexer, the divisor of the first integer divider, and the divisor of the second integer divider.

19 Claims, 5 Drawing Sheets

US 8,913,706 B2

MULTI-CHANNEL MULTI-PROTOCOL TRANSCEIVER WITH INDEPENDENT CHANNEL CONFIGURATION USING SINGLE FREQUENCY REFERENCE CLOCK SOURCE

CROSS REFERENCE TO RELATED APPLICATIONS

This application claims the benefit under 35 U.S.C. §119 (e) to U.S. Provisional Patent Application No. 61/362,589, filed Jul. 8, 2010, which is incorporated by reference herein in its entirety.

FIELD

The invention is directed to transceivers producing one of a plurality of output clock frequencies based on a received constant reference clock frequency, the one of the plurality of output clock frequencies based on a selected communications protocol, and more particularly the invention is directed to a multi-channel, multi-protocol transceiver including a programmable multi-protocol phase lock loop system.

BRIEF DESCRIPTION OF THE DRAWINGS/FIGURES

The accompanying drawings, which are incorporated herein and form part of the specification, illustrate the present invention and, together with the description, further serve to explain the principles of the invention and to allow a person skilled in the relevant art(s) to make and use the invention FIG. 1 shows a communications system.

Figure 1:
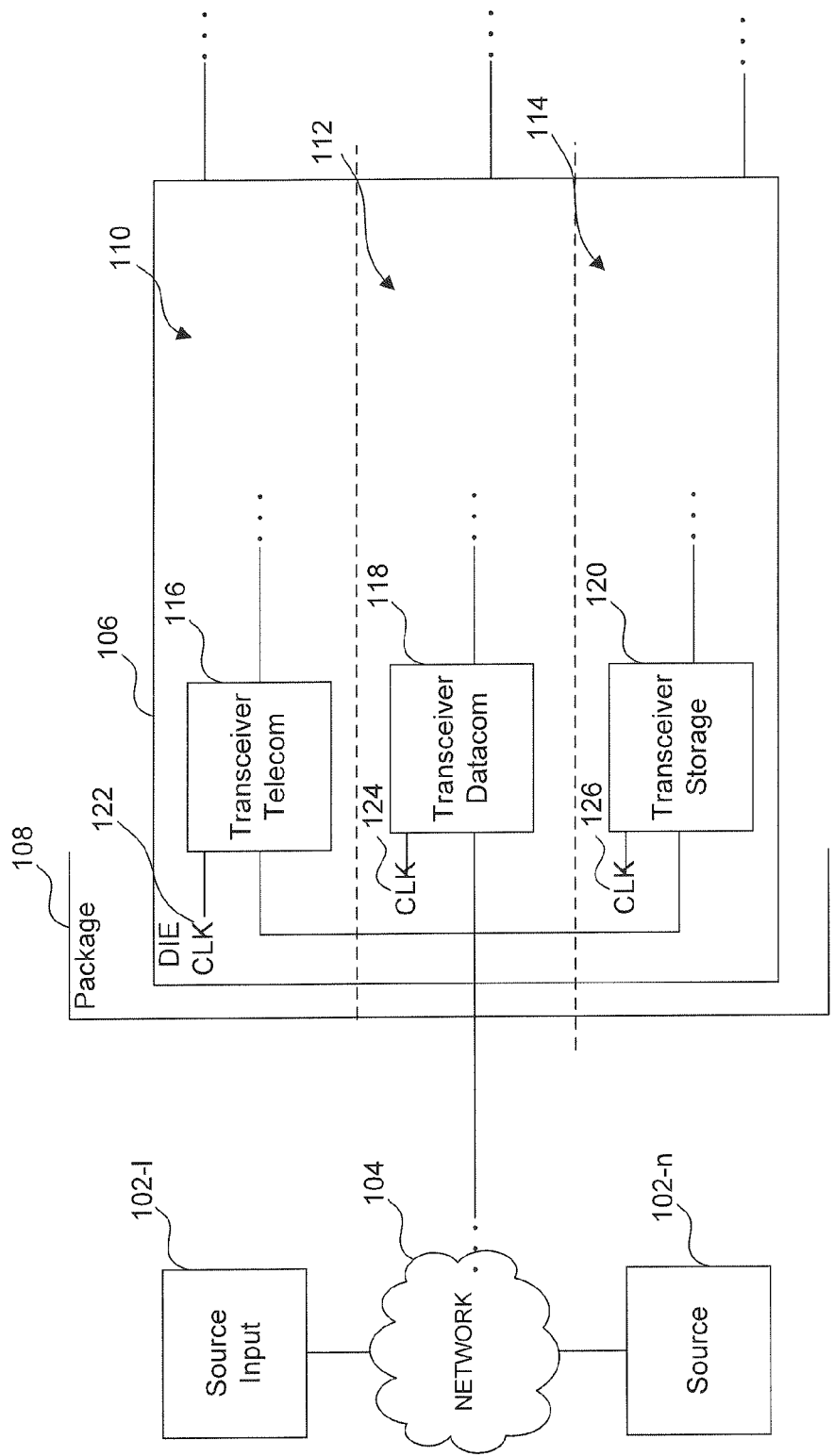

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

A phase lock loop (PLL) is used in many different communications systems, e.g., radio, wireless, telecommunications, Internet, etc. For example, PLLs can be used to produce stable, low noise tunable RF signals for radio, timing, and wireless communications. PLLs can be used within a transceiver to up-convert outgoing data for transmission and down-convert a received signal for processing. Basically, a PLL is a feedback control loop circuit that synchronizes the phase of a generated signal with that of a reference signal, e.g., a clock signal. PLLs can generate signals that are integer multiples of the reference or clock signal.

In current communications systems, transceivers and incorporated PLLs operate under different reference clocks and at different speeds based on a data type for a particular channel. Each type of channel, e.g., data or storage, is associated with a particular, and usually different, communications protocol, where each protocol operates at a different frequency or speed. For example, different protocols are used for storage channels, e.g., 8G Fiber Channel, and data channels, e.g., 1G or 10G Ethernet.

FIG. 1 shows a communications system 100. Communications system 100 can include data sources 102-1 to 102-n, n being a positive integer, a network 104, and a die 106 (hereinafter die, chip, or silicon is used interchangeably) within a package 108. It is to be appreciated any number of dies within or associated with any number of packages may receive data from network 104, and any number shown in the Figures are non-limiting.

In one example, data sources 102-1 to 102-n can produce any type of data, e.g., telecom, datacom, and storage.

In one example, network 104 can be any type of network, e.g., wired or wireless, Internet, etc.

In one example, die 106 can be segmented into different sub-networks that serve different applications. For example, a telecom sub-network 110, a data communications sub-network 112, or a data storage sub-network 114, where each sub-network has an associated protocol. In one example, each sub-network includes a transceiver, e.g., respective transceivers 116, 118, and 120, and a respective clock to drive the transceivers, e.g., respective clocks 122, 124, and 126. For most configurations, each respective transceiver in each respective sub-network operates at a different speed, thus requiring the respective clocks to operate at different frequencies.

Although not specifically shown, as would be apparent to a skilled artisan, die 106 could further include analog and digital circuits to process analog and digital signals transmitted to and from the transceivers, respectively.

Figure 2:
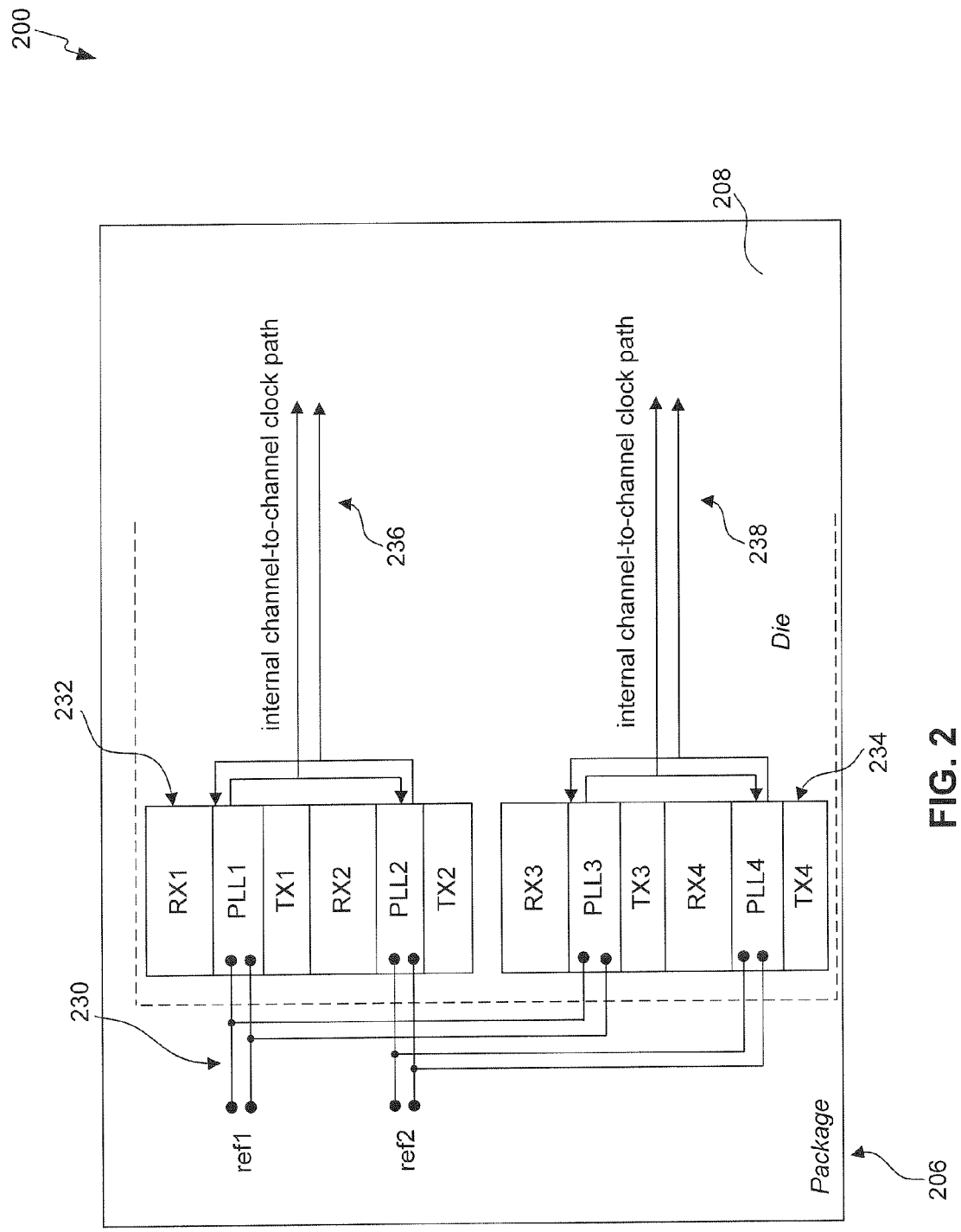
FIG. 2 shows a package and die arrangement.

FIG. 2 shows a packaging and die arrangement 200. In the example shown, arrangement 200 includes a package 208 and a die 206, with a phantom dashed line shown as a boundary between. For example, arrangement 200 may be implemented in system 100.

In this example, package 208 includes first and second reference clocks ref1 and ref2, respectively, and a routing system 230 that can route clock signals to respective down stream devices.

In this example, die 206 includes a first transceiver 232 and a second transceiver 234. Each transceiver 232 and 234 can be coupled to a respective signal communications path 236 or 238. Transceiver 232 comprises first and second receivers RX1 and RX2, first and second transmitters TX1 and TX2, and first and second PLLs, PLL1 and PLL2. In this example, each PLL, i.e., PLL1 and PLL2, receives a corresponding respective clock signal from respective reference clocks ref1 or ref2. Similarly, second transceiver 234 comprises third and fourth receivers RX3 and RX4, third and fourth transmitters TX3 and TX4, and third and fourth PLLs, PLL3 and PLL4. In this example, each PLL, i.e., PLL3 and PLL4, receives a corresponding respective clock signal, i.e., PLL3 receives clock signal from reference clock ref1 and PLL4 receives clock signal from reference clock ref2.

In one example, arrangement 200 comprises a clocking scheme for multi-channel multi-protocol transceivers 232 and 234 with four integrated channels and two separate reference clock sources ref1 and ref2. First through fourth PLLs, PLL1, PLL2, PLL3, and PLL4, are coupled to both clocks ref1 and ref2 through a network of clock paths on package 208 and/or on chip 206. For example, ref1 is connected to PLL1 and PLL3 through routing system 230 and ref2 is connected to PLL2 and PLL4 through routing system 230. However, PLL1 and PLL3 are connected to ref2 and PLL2 and PLL4 are connected to ref1 through on-chip networks 236 and 238.

While the architecture of FIG. 2 allows each PLL to be configured independently, the architecture can introduce issues that affect performance of chip 206. First, this configuration uses separate reference clocks, ref1 and ref2, which can increase the total system cost and can occupy more area on a system board. Second, the reference clock network of different frequencies on package 208 is susceptible to crosstalk and noise coupling. To ensure a clean clock source, a more complicated package configuration may be needed, which can increase the cost of the package. Third, bi-directional on-chip clock channels 236 and 238 occupy silicon area and may need strong buffers to drive the clock signal to prevent degradation of the reference clock signal. This can increase the chip cost and power. Forth, this architecture is very hard to scale so that the chip 206 can accommodate more channels and more protocols. Scaling may be difficult because it will make the routing of the reference clock signals very congested regardless if the routing is via package 208 or on chip 206.

As a result of the tremendous data volume growth, data port density of the network cards is higher and higher, which requires that transceivers have multiple channels integrated in a same chip. Also, based on rapid growth of internet data traffic, end-users desire systems that are adaptive and versatile. For example, there is a desire that each transceiver can be reconfigurable to support different protocols, such as 8G Fiber Channel (e.g., 8.5 Gbps), 1G or 10G Ethernet, Synchronous Optical Networking (SONET), etc.

Therefore, what is needed is a system and method that allows for scalable multi-channel, multi-protocol transceivers or reconfigurable transceivers.

An embodiment of the present invention provides a circuit for producing one of a plurality of output clock frequencies from a single, constant input reference clock frequency. The circuit comprises a reference clock system and a phase lock loop. The reference clock system includes a bypass path, a divider path including a first integer divider, and a multiplexer. A divisor of the first integer divider is based on a selected communications protocol. The multiplexer is configured to route the bypass path or the divider path based on the selected communications protocol. The phase lock loop includes a voltage controlled oscillator and a feedback path. The feedback path includes a second integer divider. A divisor of the second integer divider is based on the selected communications protocol. The reference clock system is configured to receive a constant reference clock frequency. The voltage controlled oscillator is configured to produce one of a plurality of output clock frequencies corresponding to one of a plurality of possible communications protocols, where a selected output clock frequency is produced based on: the routing of the multiplexer, the divisor of the first integer divider, and the divisor of the second integer divider.

Another embodiment of the present invention provides a method including the following steps (not necessarily including all steps or in the order shown). Routing a constant reference clock signal through a bypass path or a divider path to an input of a phase lock loop based on a selected communications protocol. The divider path including a first integer divider having a first divisor. The first divisor being based on the selected communications protocol. Receiving, at the input of the phase lock loop, a feedback signal from a feedback path of the phase lock loop. The feedback path being from an output of the phase lock loop, and the feedback path including a second integer divider having a second divisor. The second divisor being based on the selected communications protocol. Producing, from the output of the phase lock loop, one of a plurality of output clock frequencies corresponding to the selected communications protocol. The one of the plurality of output clock frequencies being produced based on at least one of the routing, the divisor of the first integer divider, and the divisor of the second integer divider.

A further embodiment of the present invention provides a system comprising a transceiver and a programmable phase lock loop system. The programmable phase lock loop system comprises a reference clock system and a phase lock loop. The reference clock system includes a bypass path, a divider path including a first integer divider, and a multiplexer. A divisor of the first integer divider is based on a selected communications protocol. The multiplexer is configured to route the bypass path or the divider path based on the selected communications protocol. The phase lock loop includes a voltage controlled oscillator and a feedback path. The feedback path includes a second integer divider. A divisor of the second integer divider is based on the selected communications protocol. The reference clock system is configured to receive a constant reference clock frequency. The voltage controlled oscillator is configured to produce one of a plurality of output clock frequencies corresponding to the selected communications protocol, the one of the plurality of output clock frequencies being produced based on at least one of the routing of the multiplexer, the divisor of the first integer divider, and the divisor of the second integer divider.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

Figure 3:
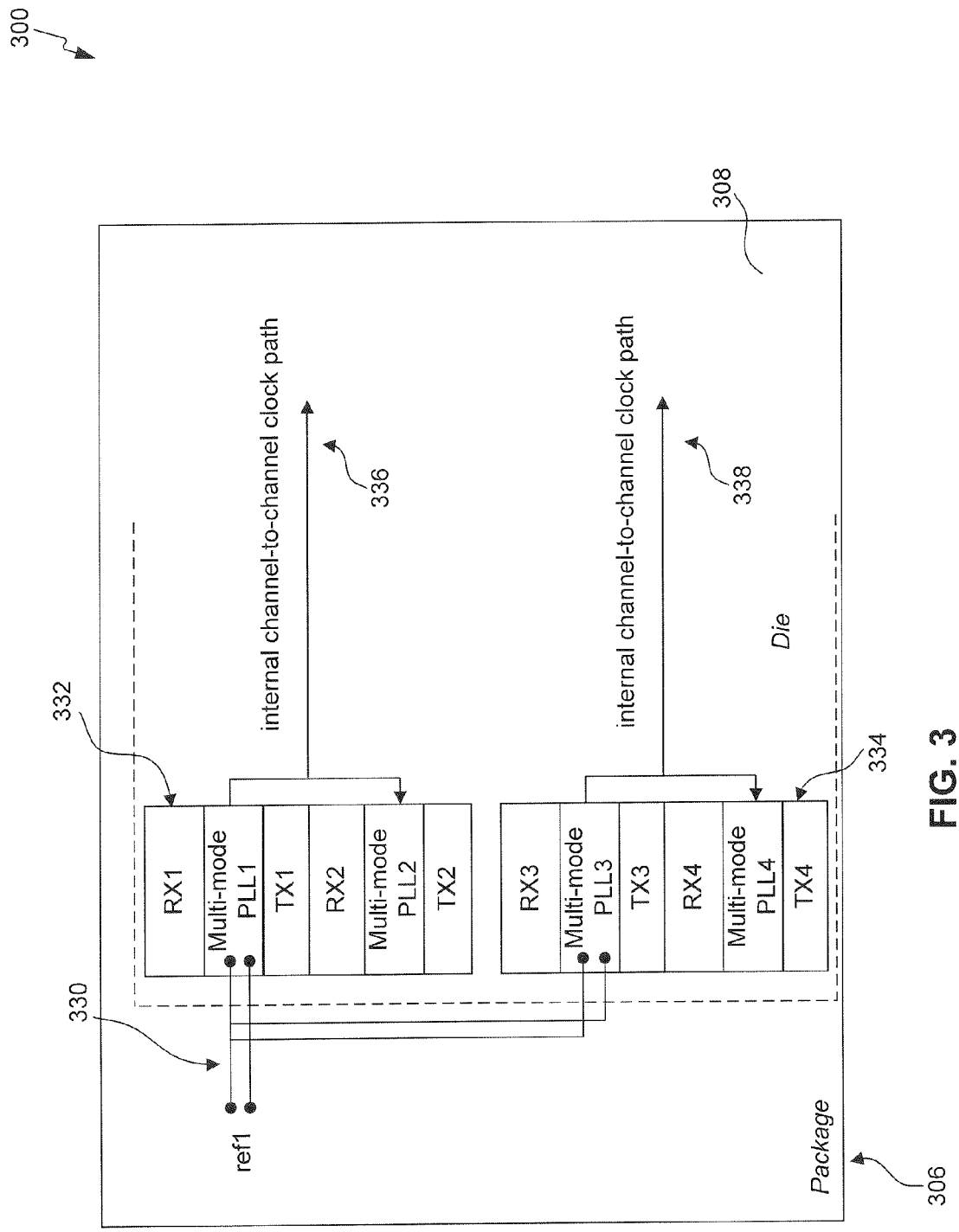
FIG. 3 shows a package and die arrangement, according to an embodiment of the present invention.

FIG. 3 shows a package and die arrangement 300, according to an embodiment of the present invention. In the example shown, arrangement 300 includes a package 308 and a die 306, with a phantom dashed line shown as a boundary there between. For example, arrangement 300 may be implemented in system 100.

In this example, package 308 includes reference clock ref1 and a routing system 330. It is to be appreciated that, based on a desired configuration of arrangement 300, the boundary between die 306 and package 308 can shift placing clock ref1 and any amount of routing system 330 on either side of the boundary, which is discussed in more detail below. It is also to be appreciated that, although shown on a single level (or layer), package 308 and/or die 306 may have a multiple level (or layer) configuration having signal channels through and between each level to allow for complex signal routing.

In this example, die 306 includes a first transceiver 332 and a second transceiver 334, although a single transceiver can also be used without departing from the present invention. In this example, each respective transceiver 332 and 334 is coupled to a respective signal communications path 336 or 338. Transceiver 332 comprises first and second receivers RX1 and RX2, first and second transmitters TX1 and TX2, and first and second PLLs, PLL1 and PLL2. It is to be appreciated a transceiver may include only a single PLL. In this example, each PLL, i.e., PLL1 and PLL2, receives a same clock signal from reference clock ref1. Similarly, second transceiver 334 comprises third and fourth receivers RX3 and RX4, third and fourth transmitters TX3 and TX4, and third and fourth PLLs, PLL3 and PLL4. In this example, each PLL, i.e., PLL3 and PLL4, receives a same clock signal from reference clock ref1. Herein, a particular TXn, RXn (i.e., TX1, RX1) maybe alternatively referred to as a communications channel.

It is to be appreciated that, although two of each device are shown in FIG. 3, more or less transceivers and associated receivers, transmitters, and PLLs can be used without departing from the scope of the invention.

As can be seen, arrangement 300 is similar to arrangement 200 in FIG. 2, with the exception that only one reference clock ref1 is utilized in arrangement 300. The frequency of the reference clock can be pre-selected to optimize/improve the performance of one of the communication protocols that are capable of being supported, but the pre-selected reference clock is also used to support additional communications protocols, as will be shown below. For example, an appropriate clock frequency can be selected for 8G Fiber Channel (e.g., 8.5 Gbps), 1G or 10G Ethernet, Synchronous Optical Networking (SONET), etc. Also, in one example, as discussed in more detail below, transceivers 332 and 334 are adjustable, via an adjustable or programmable PLL, to allow for their efficient operation regardless of which communication protocol is being used.

In the embodiment shown in FIG. 2, a fundamental reason for the non-scalable and complicated reference clock scheme for the multi-channel multi-protocol transceivers 232 and 234 is the use of multiple reference clocks ref1 and ref1. Using multiple clocks was a result of the PLLs operating at different frequencies for different communication protocols. If those frequencies do not have a common divisor, then they usually require reference clock sources with different frequencies. For example, 8G fiber channel data rate is 8.5 Gbps and 10G Ethernet is running at 10.3125 Gbps, and they will require two different reference clock sources using conventional systems.

In order to improve operation efficiency, the embodiment shown in FIG. 3 has an architecture allowing for independent channel configuration, while also being scalable for multi-channel, multi-protocol transceivers 332 and 334. In this example, only one reference clock ref1 is used, which makes the distribution of the reference clock signal much easier. Also, because arrangement 300 does not use separate reference clocks, total system cost and area on the system board can be reduced. Further, using a single reference clock substantially eliminates cross talk typically caused between different reference clocks, which greatly simplifies the reference clock routing network and reduces package cost. Even further, using a single reference clock substantially eliminates bi-directional on-chip clock channels, which also reduces the chip area and power. Still further, using a single reference clock allows easy scalability, so that the chip can accommodate more channels and more protocols, which helps to further increase the integration level of the chips and flexibility of the network.

In one example, the individual channels of a transceiver 332 or 334 may support either 8G fiber channel or 10G Ethernet using the single reference clock ref1. Since 10G Ethernet has more stringent jitter requirements, the reference clock frequency is selected for 10G Ethernet operations.

Figure 4:
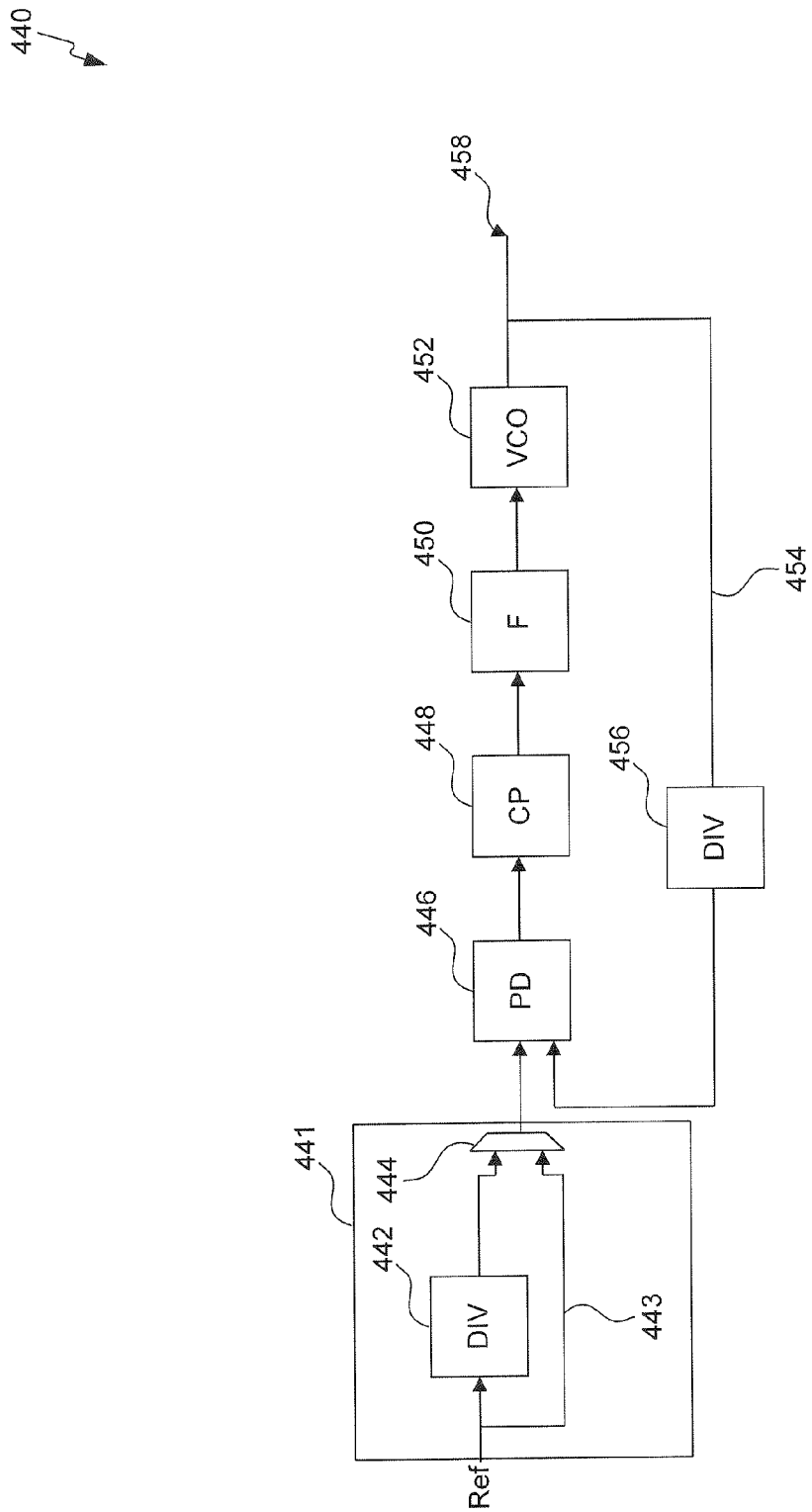
FIG. 4 shows a phase lock loop system, according to an embodiment of the present invention.

FIG. 4 shows a phase lock loop system 440, according to an embodiment of the present invention. In one example, each of PLL1, PLL2, PLL3, and PLL4 in FIG. 3 can be implemented using PLL system 440. In one example, PLL system 440 comprises a reference clock system 441 and a phase lock loop.

In this example, reference clock system 441 comprises a divider path including a first divider 442, e.g., a first integer divider, a bypass path 443, and a multiplexer 444.

In this example, the phase lock loop includes a phase detector (PD) 446, a charge pump (CP) 448, a filter (F) 450, a voltage controlled oscillator (VCO) 452, and a feedback path 454 between VCO 452 and PD 446. Feedback path 454 includes a second divider 456, e.g., a second integer divider.

In one example, a constant reference clock frequency, Ref, is received at reference clock system 441. For example, Ref can be 156.25 MHz. Based on a selected communication protocol for phase lock loop system 440, reference clock system 441 outputs either Ref via bypass path 443 or a divided signal based on Ref via the divider path. Also, a divisor of first integer divider 442 is based on the selected communications protocol. Multiplexer 444 controls which version of Ref that is output from reference clock system 441. In one example, a control signal is used to select which channel or input of multiplexer 444 is routed to PD 446. For example, if a non-divided version of reference clock signal Ref is selected, the bypass path 443 is routed through control of multiplexer 444. Similarly, if a divided version of Ref is selected, the divided path is routed through control of multiplexer 444.

Similarly, a divisor of second integer divider 456 can be set based on the selected communications protocol.

In one example, although a single reference clock Ref is utilized, through selection of the bypass or divider path, setting of a divisor of first divider 442 and a divisor value of second divider 456, PLL 440 can efficiently operate to produce different output frequency 458 corresponding to the selected communications protocols. For example, if the selected communications protocol is 10G Ethernet, then the constant reference clock Ref is selected to be approximately 156.25 MHz. Further, the multiplexer 444 selects bypass path 443 to be coupled to PD 446, and the divisor of second integer divider 456 is set to approximately 66, so that the frequency of the output clock 458 is about 10.3125 GHz.

In another example, if the selected communications protocol is 8G Fiber Channel, then the constant reference clock Ref is still approximately 156.25 MHz. Additionally, the multiplexer 444 selects the output of first integer divider 442 to be coupled to the PD 446, where the divisor of first integer divider 442 is approximately 5. Additionally, the divisor of second integer divider 456 is approximately 272, and so that the frequency of the output clock 458 is about 8.5 GHz.

Similar, for other protocols, other similar configurations can be used. This configuration can be expanded and varied to support additional communications protocols other than those discussed herein.

In one example, operation of the PLL 440 can fall within a certain threshold jitter range. Therefore, when using a single reference clock frequency, e.g., 156.25 MHz, divisors for first and second dividers 442 and 456 can be set based on a desired communication protocol, e.g., an integer value for 10G Ethernet or 8G Fiber Channel. Then, PLL 440 can operate to produce an optimal output signal 458, while exhibiting jitter within a desirable threshold value or range.

Also, in one example, changing of divisors for integer dividers 442 and 456 can allow for adjustment of PLL 440 so that they effectively operate for various communication protocols without degradation of performance. For example, referring back to FIG. 3, PLL 400 can enable multi-mode PLL1 to support a first communications protocol (e.g., 8G Fiber channel), that is adjacent to multi-mode PLL2 that supports a second communications protocol (e.g., 10G Fiber channel), where both PLLs use a single reference signal Ref1.

In this example, integer dividers 442 and 456 are used because it is known that fractional dividers in the PLL feedback path may introduce extra jitter, which is undesirable. However, if a large jitter tolerance is allowed, alternatively fractional dividers can be used.

As shown in the example of FIG. 4, using a single reference clock Ref for different protocols can be achieved through use of a programmable (e.g., multi-mode programmable) PLL, e.g., PLL 440. PLL 440 can produce various clock bases for the operation of an associated transceiver (not shown) using the same, constant reference, even if the output frequencies do not have a common divisor. In that case, first and second dividers 442 and 456 are employed inside the PLL 440 so that the correct output frequencies can be generated. However, for different communication protocols, not only the operation frequencies are different, the requirement on clock jitter is usually different. A careful selection of the reference clock frequency can substantially alleviate or control undesirable jitter so that jitter remains below a threshold value.

Therefore, in various examples, one or more of the following configurations can be employed e.g., in the embodiments shown in FIGS. 3 and 4, within the scope of the present invention, to gain advantages over the embodiment shown in FIG. 2.

A single reference clock ref1 is used for a multi-channel, multi-protocol transceiver 332 or 334.

A single reference clock Ref is connected to each PLL, PLL1-PLL4, to allow independent channel configuration.

Through moving of the boundary between package 308 and die 306, a reference clock network can be implemented partially or all on package 308 or die 306 to obtain an optimal space and power cost.

Through moving of the boundary between package 308 and die 306, a reference clock network segmentation between package 308 and silicon 306 can be varied to optimize the clock jitter performance.

Through moving of the boundary between package 308 and die 306, reference clock network segmentation between package 308 and silicon 306 can be varied to minimize the cost of the package or silicon die. For example, if a chip or die 306 comprises predominately a digital circuit, it may be desirable to route reference clock signals through package 308 to avoid noise caused by routing clock signals through a digital circuit and cost of forming a complex die 306 that may be required to optimally route clock signals, e.g., a multiple-level die. However, if die 306 comprises predominately an analog circuit, it may be desirable to route clock signals through die 306 to avoid the cost of forming a complex package 308 that may be required to optimally route clock signals, e.g., a multiple-level package. Thus, a cost/benefit analysis can determine routing schemes.

Through moving of the boundary between package 308 and die 306, reference clock network segmentation between package 308 and silicon 306 can be varied to minimize the chip power.

Through moving of the boundary between package 308 and die 306, reference clock network segmentation between package 308 and silicon 306 can be varied to optimize the system board design.

A multimode PLL 440 can be employed to allow multi-protocol operation of the transceiver using single reference clock Ref.

In one example, fractional dividers (not shown) can be employed in the multi-mode PLL when the output frequencies do not have common divisor.

In one example, a reference clock ref1 or Ref frequency can be selected to comply with different jitter requirements of various communication protocols.

In one example, a reference clock ref1 or Ref frequency is selected so that the protocol that entails a more relaxed jitter requirement will be supported.

Figure 5:
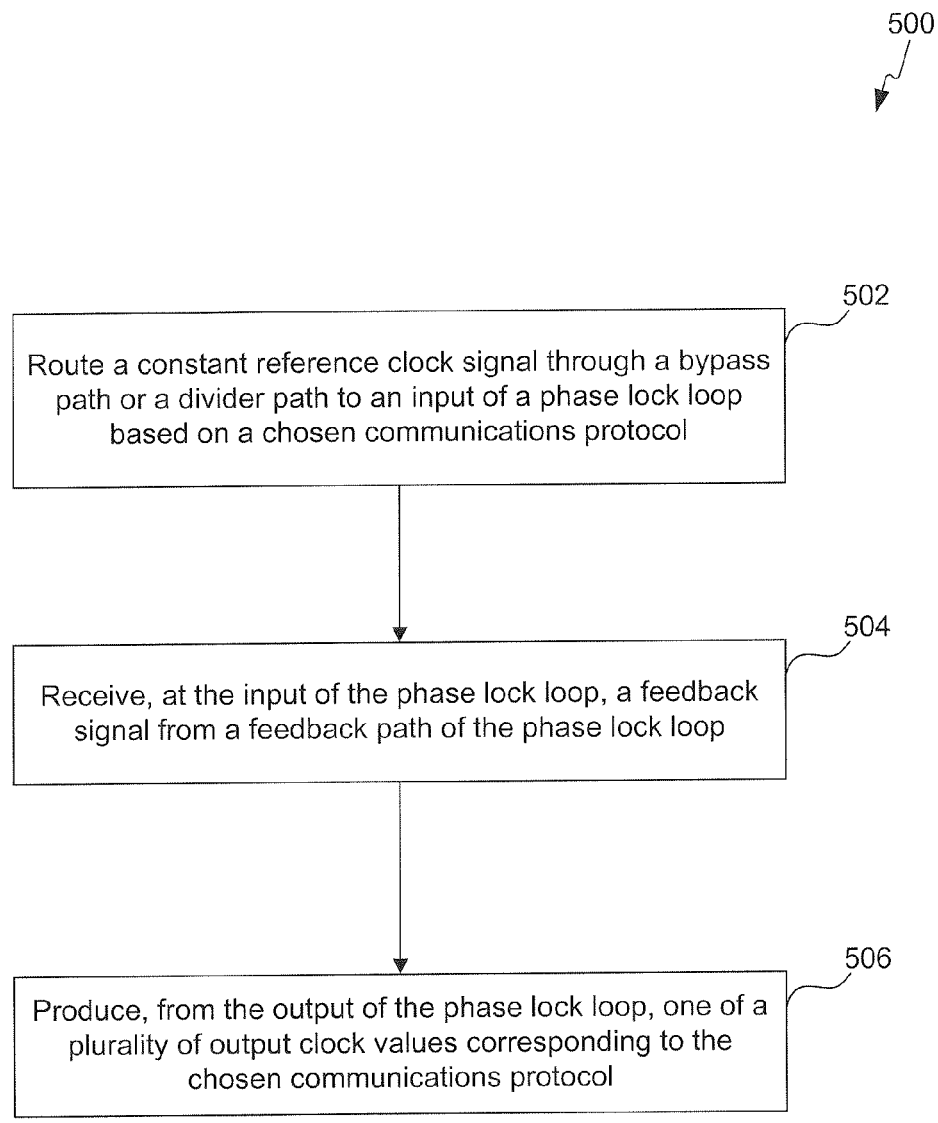
FIG. 5 shows a flowchart depicting a method, according to an embodiment of the present invention.

FIG. 5 shows a flow chart depicting a method 500, according to an embodiment of the present invention. It is to be appreciated method 500 may not include all steps shown, or perform the steps in the order shown.

In step 502, a constant reference clock signal can be routed through a bypass path or a divider path to an input of a phase lock loop based on a selected communications protocol. The divider path can include a first integer divider having a first divisor. The first divisor can be based on the selected communications protocol.

In step 504, a feedback signal is received at the input of the phase lock loop from a feedback path of the phase lock loop. The feedback path can connect an output of the phase lock loop to an input of the phase lock loop. The feedback path can include a second integer divider having a second divisor. The second divisor can be based on the selected communications protocol.

In step 506, one of a plurality of output clock frequencies corresponding to the selected communications protocol can be produced from the output of the phase lock loop. The one of the plurality of output clock frequencies can be produced based on at least one of the routing, the divisor of the first integer divider, and the divisor of the second integer divider.

It is to be appreciated that the Detailed Description section, and not other sections, is intended to be used to interpret the claims. The other sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A transceiver system comprising:
   a plurality of transmitters;
   a plurality of receivers; and
   a plurality of phase lock loop systems, wherein each of the plurality of phase lock loop systems comprises:
      a plurality of reference clock systems configured to receive a constant reference clock frequency, wherein each of the plurality of reference clock systems comprises:
         a bypass path,
         a divider path, the divider path including an adjustable divider configured to change a value of a divisor of the adjustable divider that divides the constant reference clock frequency, wherein the value is adjusted and set each time based on a selected communications protocol of a plurality of possible communications protocols, and
         a multiplexer configured to route the bypass path or the divider path based on the selected communications protocol,
      wherein, at any given time, the divisor value of each adjustable divider of the plurality of reference clock systems is different from a divisor value of each other adjustable divider of the plurality of reference clock systems; and
      a plurality of phase lock loops, wherein each of the plurality of phase lock loops comprises:
         a feedback path, the feedback path including an integer divider, wherein a divisor of the integer divider is set based on the selected communications protocol, and
         a voltage controlled oscillator configured to produce one of a plurality of output clock frequencies corresponding to the selected communications protocol, wherein the one of the plurality of output clock frequencies is produced based on at least one of the routings of the multiplexer, the divisor of the adjustable divider, and the divisor of the integer divider,
      wherein the divisor of each integer divider of the plurality of phase lock loops is different from a divisor of each other integer divider of the plurality of phase lock loops.

2. The transceiver system of claim 1, wherein the selected communications protocol comprises at least one of 100 Ethernet, 1G Ethernet, 8G Fiber Channel, and Synchronous Optical Networking.

3. The transceiver system of claim 2, wherein, in response to the selected communications protocol being 10G Ethernet:
   the constant reference clock frequency comprises approximately 156.25 MHz;
   the multiplexer is configured to route the bypass path;
   the divisor of the integer divider comprises approximately 66; and
   the voltage controlled oscillator is configured to produce approximately 10.3125 GHz as the one of the plurality of output clock frequencies.

4. The transceiver system of claim 2, wherein, in response to the selected communications protocol being 8G Fiber Channel:
   the constant reference clock frequency comprises approximately 156.25 MHz;
   the multiplexer is configured to route the divider path;
   the divisor of the adjustable divider comprises approximately 5;
   the divisor of the integer divider comprises approximately 272; and
   the voltage controlled oscillator is configured to produce approximately 8.5 GHz as the one of the plurality of output clock frequencies.

5. The transceiver system of claim 1, further comprising:
   a package; and
   a die surrounded by and supported by the package.

6. The transceiver system of claim 5, wherein the plurality of reference clock systems is located on the package.

7. The transceiver system of claim 1, wherein the plurality of transmitters, the plurality of receivers, and the plurality of phase lock loop systems are located on a single die.

8. The transceiver system of claim 5, further comprising:
   a routing system configured to route the constant reference clock frequency from the plurality of reference clock systems to each of the plurality of the phase lock loop systems.

9. The transceiver system of claim 8, wherein a substantial portion of the routing system is on the package.

10. The transceiver system of claim 8, wherein a substantial portion of the routing system is on the die.

11. A communication system comprising:
    a reference clock configured to output a constant clock frequency; and
    a first transceiver comprising:
       a first phase lock loop system comprising:
          a first reference clock system configured to receive the constant clock frequency comprising a first adjustable divider, and
          a first phase lock loop configured to produce a first output clock frequency based on the constant clock frequency to support a first selected communications protocol of a plurality of possible communications protocols, the first phase lock loop comprising a first integer divider; and
a second phase lock loop system comprising:
a second reference clock system configured to receive the constant clock frequency comprising a second adjustable divider; and
a second phase lock loop configured to produce a second output clock frequency based on the constant clock frequency to support a second selected communications protocol of the plurality of possible communications protocols, the second output clock frequency being different from the first output clock frequency and the second communications protocol being different from the first communications protocol, the second phase lock loop comprising a second integer divider,
wherein a divisor of the first adjustable divider is different from a divisor of the second adjustable divider, or
wherein a divisor of the first integer divider is different from a divisor of the second integer divider.

12. The communication system of claim 11, wherein the second phase lock loop system is coupled to the reference clock through the first phase lock loop system.

13. The communication system of claim 11, further comprising:
a second transceiver comprising:
a third phase lock loop system comprising:
a third reference clock system configured to receive the constant clock frequency, and
a third phase lock loop configured to produce a third output clock frequency based on the constant clock frequency; and
a fourth phase lock loop system comprising:
a fourth reference clock system configured to receive the constant clock frequency; and
a fourth phase lock loop configured to produce a fourth output clock frequency based on the constant clock frequency to support a fourth communication protocol, the fourth output clock frequency being different from the third output clock frequency.

14. The communication system of claim 13, wherein the fourth phase lock loop system is coupled to the reference clock through the third phase lock loop system.

15. The communication system of claim 13, wherein the first phase lock loop system is coupled to the third phase lock loop system.

16. The communication system of claim 13, wherein the first and second transceivers are located on a single die.

17. A transceiver system comprising:
a plurality of transmitters;
a plurality of receivers; and
a plurality of phase lock loop systems, wherein each of the plurality of phase lock loop systems comprises:
a reference clock system configured to receive a constant reference clock frequency, the reference clock system comprising:
a bypass path,
a divider path, the divider path including an adjustable divider configured to change a value of a divisor that divides the constant reference clock frequency, and
a multiplexer configured to route the bypass path or the divider path based on the selected communications protocol; and
a phase lock loop, the phase lock loop comprising:
a feedback path, the feedback path including an integer divider, wherein a divisor of the integer divider is set based on a selected communications protocol, and
a voltage controlled oscillator configured to produce one of a plurality of output clock frequencies corresponding to the selected communications protocol, wherein the one of the plurality of output clock frequencies is produced based on at least one of the routings of the multiplexer, a divisor of the adjustable divider, and the divisor of the integer divider,
wherein:
each reference clock system of each of the plurality of phase lock loop systems receives the constant reference clock frequency from a single reference clock; and
the divisor of the adjustable divider is different from a divisor of each other adjustable divider of the plurality of phase lock loop systems; or
the divisor of the integer divider of the phase lock loop is different from a divisor of each other integer divider of the plurality of phase lock loop systems.

18. The transceiver system of claim 17, wherein at least one of the plurality of phase lock loop systems is coupled to the single reference clock through another one of the plurality of phase lock loop systems.

19. The transceiver system of claim 17, wherein the selected communications protocol comprises at least one of 10G Ethernet, 1G Ethernet, 8G Fiber Channel, and Synchronous Optical Networking.

* * * * *

UNITED STATES PATENT AND TRADEMARK OFFICE
CERTIFICATE OF CORRECTION

PATENT NO. : 8,913,706 B2
APPLICATION NO. : 12/860596
DATED : December 16, 2014
INVENTOR(S) : Cao et al.

Page 1 of 1

It is certified that error appears in the above-identified patent and that said Letters Patent is hereby corrected as shown below:

In the Claims

Column 10, lines 12-13, please replace "100 Ethernet," with --10G Ethernet--.

Signed and Sealed this
Fifth Day of May, 2015

Michelle K. Lee
*Director of the United States Patent and Trademark Office*